United States Patent
Matsushima

(10) Patent No.: US 10,306,772 B2
(45) Date of Patent: May 28, 2019

(54) METHOD FOR MANUFACTURING FLEXIBLE MOUNTING MODULE BODY

(71) Applicant: DEXERIALS CORPORATION, Tokyo (JP)

(72) Inventor: Takayuki Matsushima, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 208 days.

(21) Appl. No.: 15/269,354

(22) Filed: Sep. 19, 2016

(65) Prior Publication Data

US 2017/0006712 A1 Jan. 5, 2017

Related U.S. Application Data

(63) Continuation of application No. PCT/JP2015/053999, filed on Feb. 13, 2015.

(30) Foreign Application Priority Data

Mar. 18, 2014 (JP) .................................. 2014-055163

(51) Int. Cl.
*H05K 1/02* (2006.01)
*H05K 3/34* (2006.01)
(Continued)

(52) U.S. Cl.
CPC ............ *H05K 3/3494* (2013.01); *G09F 9/00* (2013.01); *H01L 24/81* (2013.01); *H01L 24/83* (2013.01);
(Continued)

(58) Field of Classification Search
CPC . H01L 2224/16225; H01L 2224/32225; H01L 2224/73204; H01L 2924/00012;
(Continued)

(56) References Cited

U.S. PATENT DOCUMENTS 4,917,466 A * 4/1990 Nakamura .......... G02F 1/13452
257/737
9,627,128 B2 * 4/2017 Saito .................... H01Q 1/2216
(Continued)

FOREIGN PATENT DOCUMENTS

JP   H06-310839 A   11/1994
JP   H11-65473 A    3/1999
(Continued)

*Primary Examiner* — Minh Trinh
(74) *Attorney, Agent, or Firm* — Oliff PLC

(57) ABSTRACT

An adhesive film including a substrate film and an adhesive agent layer formed thereon is adhered to the back surface side of a mounting region of a flexible substrate, and an electronic component is mounted on the front surface side. An adhesive agent in the adhesive agent layer contains silica fine particles having a primary particle diameter of less than 100 nm, and the adhesive agent layer has a shear storage elastic modulus at 160° C. of 0.15 MPa or more. When the anisotropic conductive film is disposed on the mounting region and the electronic component is mounted on the anisotropic conductive film by heating and pressing, the adhesive agent is not pushed out to a large extent, and conductive particles sandwiched between a bump on the electronic component and the electrode are pressed and squashed, improving an electrical connection between the electronic component and the electrode.

7 Claims, 3 Drawing Sheets

(51) Int. Cl.
*G09F 9/00* (2006.01)
*H05K 1/18* (2006.01)
*H05K 3/32* (2006.01)
*H01L 23/00* (2006.01)

(52) U.S. Cl.
CPC ............ *H01L 24/92* (2013.01); *H05K 1/189* (2013.01); *H05K 3/321* (2013.01); *H05K 3/323* (2013.01); *H01L 2224/16225* (2013.01); *H01L 2224/2919* (2013.01); *H01L 2224/32225* (2013.01); *H01L 2224/73204* (2013.01); *H01L 2224/81203* (2013.01); *H01L 2224/83192* (2013.01); *H01L 2224/83203* (2013.01); *H01L 2924/12044* (2013.01); *H01L 2924/20105* (2013.01); *H05K 2201/10128* (2013.01); *H05K 2201/10136* (2013.01)

(58) Field of Classification Search
CPC ... H01L 2224/2919; H01L 2224/81203; H01L 2224/83192; H01L 2224/83203; H01L 24/81; H01L 24/83; H01L 24/92; H01L 2924/12044; H01L 2924/20105
See application file for complete search history.

(56) References Cited

U.S. PATENT DOCUMENTS 9,741,598 B2 *  8/2017  Moriyama ............. B32B 27/00
2017/0006712 A1 *  1/2017  Matsushima ............. G09F 9/00

FOREIGN PATENT DOCUMENTS

| JP | 2000-162630 A | 6/2000 |
| JP | 2006-173535 A | 6/2006 |
| JP | 2006-332187 A | 12/2006 |
| JP | 2011-079959 A | 4/2011 |
| JP | 2012-116870 A | 6/2012 |
| JP | 2012-219154 A | 11/2012 |

* cited by examiner

METHOD FOR MANUFACTURING FLEXIBLE MOUNTING MODULE BODY

BACKGROUND

The disclosed embodiments relate to a technology of manufacturing a substrate having flexibility on which an electronic component is mounted.

From the viewpoint of convenience and portability, a display device including an image display unit having flexibility, such as a film liquid crystal display and a flexible organic EL display, attracts attention.

As a body component of such a display device, a flexible display substrate is used. In this flexible display substrate, a flexible substrate (such as a flexible, transparent plastic film) has an image display region for displaying an image and a mounting region where an electronic component (for example, a driver IC) for processing a picture signal of an image display device is mounted. When an electronic component is mounted, a thermosetting anisotropic conductive film is usually disposed in the mounting region, and an electronic component is disposed on the anisotropic conductive film. Then, heating and pressing are generally performed to fix the electronic component. When a plastic film that serves as a substrate is reduced in thickness, or when rigidity is decreased for further enhancing the flexibility of the flexible display substrate, the above-described heating and pressing tend to cause the substrate to be deformed or distorted, leading to deterioration of displayed images.

On the other hand, the field of circuit boards is different from the field of the above-discussed flexible display substrates but is common in terms of the use of a flexible substrate. That is, in the technical field of flexible printed circuit boards, there is a technology of adhering a reinforcing plate (backing plate) to the back surface of an external terminal region formed on the edge of the circuit board. The reinforcing plate on the back surface supports heat or stress applied on the edge so as to prevent distortion or deformation caused when the circuit board is inserted into another component or an electronic component is mounted on the circuit board.

Examples of the above-discussed reinforcing plate specifically include a thermosetting-type reinforcing plate, that is, a thermosetting sheet, as disclosed in Patent Literatures 1 to 3, and an adhesive sheet as disclosed in Patent Literatures 4 and 5.

CITATION LIST

Patent Literature

Patent Literature 1: JPA No. 2012-219154
Patent Literature 2: JPA No. 2012-116870
Patent Literature 3: JPA No. 2011-79959
Patent Literature 4: JPA No. 2006-332187
Patent Literature 5: JPA No. 2006-173535

SUMMARY

Therefore, it is conceivable that the back surface of the mounting region of the aforementioned flexible display substrate is also backed by the reinforcing plate disclosed in Patent Literatures 1 to 5, and after that an electronic component is mounted.

However, when the thermosetting sheet disclosed in Patent Literatures 1 to 3 is used as a reinforcing plate, the process needs to be performed at low temperature and for a short period (100° C. or lower/several minutes) to reduce influence on a display element (for example, a liquid crystal element and an EL element) disposed in the image display region of the flexible display substrate. However, the above-discussed thermosetting sheet can have an insufficient reaction rate, and it might not be cured by heat to a required degree.

On the other hand, when the adhesive sheet like those disclosed in Patent Literatures 4 and 5 is used as a reinforcing plate, the above-discussed problem is not caused. However, disposing an anisotropic conductive film in the mounting region and heating (170° C./5 sec) and pressing an electronic component (such as an IC) can cause the adhesive sheet to be deformed by the heat, thereby deteriorating reliability of the mounting state. In particular, it can be inferred that conductive particles in the anisotropic conductive film placed under an electrode or a bump formed on an IC or the like might not be sufficiently deformed, and the adhesive sheet might be deformed during pressuring, resulting in insufficient pressure applied to the conductive particles.

Accordingly, it is conceivable that the thermosetting sheet of Patent Literatures 1 to 3 is used instead, and the amount of a curing agent is increased for enhancing the reaction rate so that connection at low temperature is enabled. However, this may reduce the preservation stability of the thermosetting sheet.

On the other hand, it is conceivable that the glass transition temperature of the adhesive agent in the adhesive sheet of Patent Literatures 4 and 5 is shifted to be rather high. However, only increasing the glass transition temperature cannot prevent the adhesive sheet from being deformed by heating and pressuring of the anisotropic conductive film. Furthermore, when the glass transition temperature is set rather high, peel strength of the adhesive sheet is generally reduced.

In one aspect, to solve the above-described problem, the disclosed embodiments can relate to a manufacturing method of a flexible mounting module body (15). The method includes (i) an anisotropic conductive film disposing step for disposing a thermosetting anisotropic conductive film including conductive particles in a mounting region provided on a disposition surface that is one surface of a flexible substrate, the flexible substrate further including a second surface that is opposite the one surface (ii) an electronic component disposing step for disposing an electronic component on the anisotropic conductive film disposed on the mounting region, and (iii) a mounting step for electrically connecting a bump of the electronic component and an electrode provided on the mounting region through the conductive particles by heating and compressing the electronic component while the bump is in contact with the anisotropic conductive film. The manufacturing method further includes an adhesive film adhering step for adhering an adhesive film to at least a portion of the second surface that is located directly opposite the mounting region. The adhesive film comprises an adhesive agent layer containing an adhesive agent and a substrate film that are laminated. The adhesive agent layer includes silica fine particles having a primary particle diameter of less than 100 nm, the adhesive agent layer has a shear storage elastic modulus at 160° C. of 0.15 MPa or more. The adhesive film adhering step is performed prior to the mounting step.

In one embodiment of the manufacturing method of a flexible mounting module body, the adhesive agent has a glass transition temperature in the range of −60° C. or higher to 20° C. or lower.

In one embodiment of the manufacturing method, in the mounting step, the electronic component is heated in the range of 150° C. or higher to 170° C. or lower when the electronic component is heated and pressed.

Furthermore, in one embodiment of the manufacturing method, an image display region for disposing display device is provided in the disposition surface, and in the adhesive film adhering step, a portion located directly opposite the image display region is included in the portion of the support surface where the adhesive film is adhered.

In one embodiment of the manufacturing method, the adhesive agent is a nitrile rubber.

In one embodiment of the manufacturing method, the nitrile rubber in the adhesive agent layer includes acrylonitrile in a ratio of 18% by weight or more and 40.5% by weight or less.

In one embodiment of the manufacturing method, the method further comprises an adhesive agent layer forming step for forming the adhesive agent layer by disposing on the substrate a film with a solution of the adhesive agent containing at least 5 parts by weight of the silica fine particles with respect to 100 parts by weight of the adhesive agent in a powder state.

According to the above-discussed manufacturing method, when an adhesive film, which serves as a reinforcing plate, is adhered to the back side of a flexible display substrate used in a film liquid crystal display and a flexible organic EL display and/or a "flexible substrate" that serves as a base material of a flexible printed circuit board or the like, so as to mount an electronic component (such as an IC) using an anisotropic conductive film, deformation of the adhesive agent layer by the electrode of IC or the like during heating and pressing is small because the adhesive agent layer of the adhesive film is adjusted to have a predetermined shear storage modulus.

Furthermore, when predetermined material properties of the adhesive agent layer are selected, peel strength to a flexible substrate can be increased.

Therefore, according to aspects of the disclosed manufacturing method of a flexible mounting module, (i) the adhesive film including the adhesive agent layer which is less deformed is used as a reinforcing plate when the electronic component is heated and pressed using the anisotropic conductive film, (ii) the pressure can be reliably applied to a degree that the conductive particles present in the anisotropic conductive film are deformed or squashed, and, thus, (iii) the electrical connection of the module is ensured.

DETAILED DESCRIPTION OF EMBODIMENTS

Figure 2:
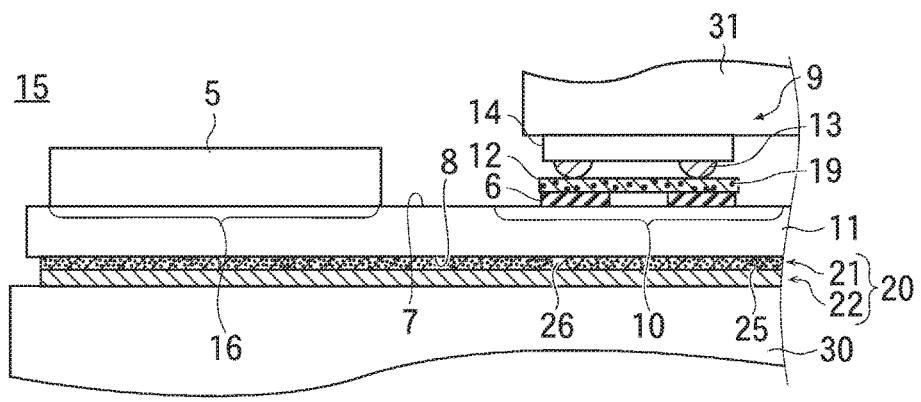
FIGS. 2(a) and 2(b) are each a diagram for explaining a step of the present invention.
Figure 2:
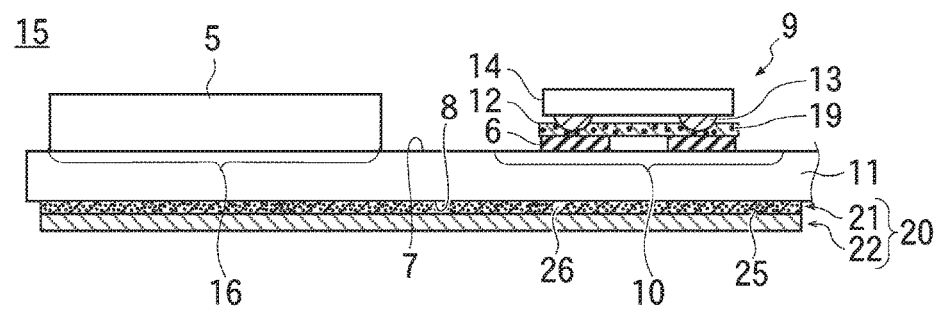

Reference numeral 15 of FIG. 2(b) indicates a flexible mounting module body obtained according to the disclosed manufacturing method. The flexible mounting module body (15) includes a flexible substrate (11) comprising a polyimide film, a polycarbonate film, a polyether sulfone film, a polyester film, or the like, an electronic component (9) which is an integrated circuit, a display device (5) having flexibility, and an adhesive film (20) as a reinforcing plate.

A disposition surface (7) which is one surface of the flexible substrate (11) has an image display region (16) and a mounting region (10). The display device (5) is disposed in the image display region (16), and the electronic component (9) is disposed in the mounting region (10). The electronic component (9) and the display device (5) are electrically connected through a patterned wiring film (not shown). Thus, letters and images are displayed on the display device (5) by an electrical signal output by an electronic circuit including the electronic component (9) to the display device (5).

The display device (5) has flexibility, and can be bent together with the flexible substrate (11).

The adhesive film (20) includes a substrate film (22) having flexibility (such as, a polyester film), an OPP film, a PE film, a PVA film, or a PVC film, and an adhesive agent layer (21) having flexibility disposed on the substrate film (22) Reference numeral 8 indicates a support surface that is the surface opposite to the disposition surface (7) of the flexible substrate (11). In the support surface (8), a portion located directly opposite the mounting region (10) is adhered with the adhesive film (20) while being in contact with the adhesive agent layer (21).

In the support surface (8), the adhesive film (20) is also adhered to a portion located directly opposite the image display region (16), in addition to the portion located directly opposite the mounting region (10).

The adhesive agent layer (21) includes an adhesive agent (26) made of a non-thermosetting resin, and silica fine particles (25) that have a primary particle size of less than 100 nm and are dispersed in the adhesive agent (26).

The shape of the silica fine particles (25) having a diameter of less than 100 nm is not particularly limited, and may be spherical, indefinite, scale-like, and the like. Examples of such silica fine particles may include "AEROSIL (registered trademark)" series available from Nippon Aerosil Co., Ltd., and "REOLOSIL (registered trademark)" series available from Tokuyama Corporation.

The non-thermosetting resin can be selected from resins having a glass transition temperature of −60° C. or higher to 20° C. or lower in order to obtain sufficient peel strength as an adhesive agent and relatively reduce deformation even in a high-temperature environment (approximately 160° C.) that is reached when an anisotropic conductive film is heated and pressed.

Specific examples of the non-thermosetting resin may include rubber-based polymers such as nitrile rubber (NBR: a copolymer of acrylonitrile and 1,3-butadiene), butyl rubber, ethylene propylene rubber, and acrylic polymers usually used in adhesive agents. These can be selected and used in view of the relationship with material properties of the flexible substrate (11).

The procedure for mounting the electronic component (9) on the flexible substrate (11) will be described.

Figure 1:
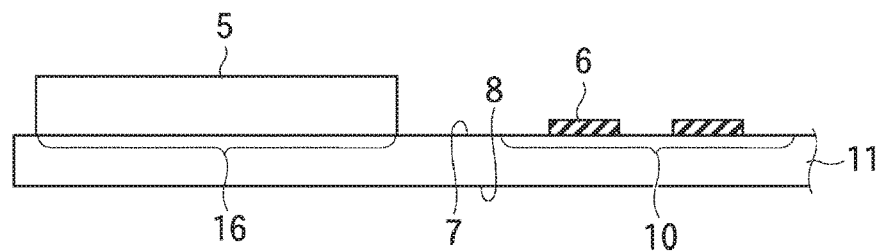
FIGS. 1(a) to 1(d) are each a diagram for explaining a step of the present invention.
Figure 1:
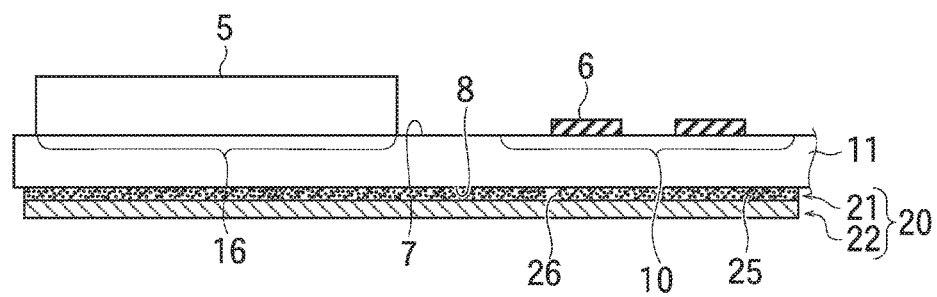
Figure 1:
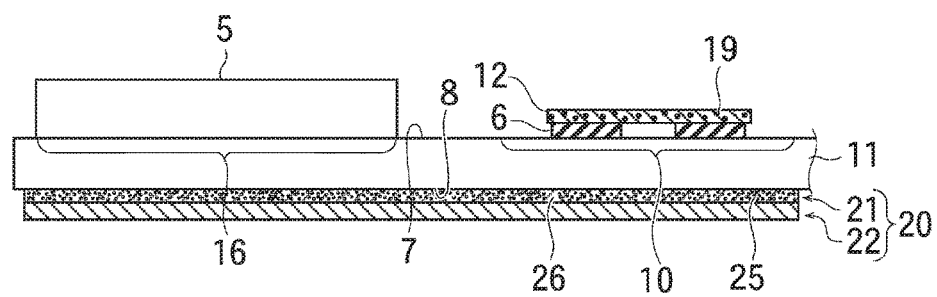
Figure 1:
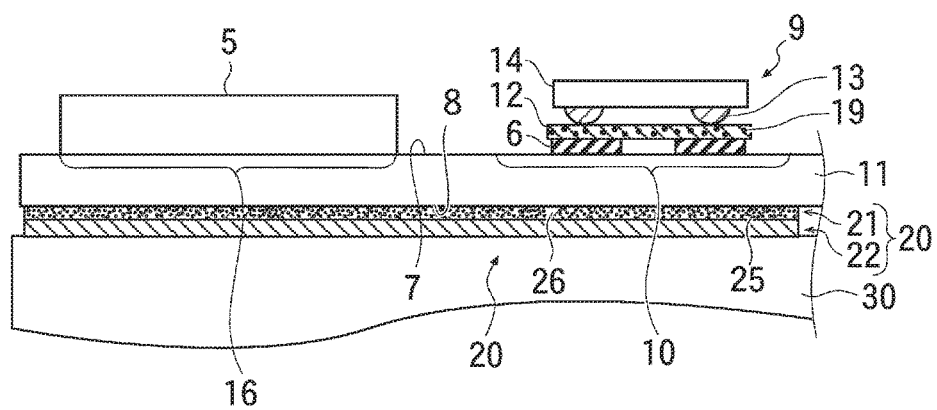

FIG. 1(a) shows a state in which the display device (5) is mounted in the image display region (16) of the flexible substrate (11), and the electronic component (9) is not mounted on the flexible substrate (11). When the flexible substrate (11) is in this state, the surface of an electrode (6) formed of a patterned metal thin film, ITO, TZO or the like is exposed in the mounting region (10) of the disposition surface (7).

In the support surface (8) of this flexible substrate (11), at least a portion of the support surface (8) located directly opposite the mounting region (10) is brought into contact with the adhesive agent layer (21), then, the adhesive film (20) is heated to a first adhering temperature while the adhesive film (20) and the flexible substrate (11) press against each other. In this manner, the adhesive film (20) is adhered to the flexible substrate (11) as shown in FIG. 1(b).

During this adhering process, because the adhesive agent of the adhesive agent layer (21) is not a thermosetting resin, the first adhering temperature is close to room temperature, and is lower than the temperature at which the flexible substrate (11) is deformed.

Next, as illustrated in FIG. 1(c), an anisotropic conductive film (12) including conductive particles (19) dispersed in a thermosetting resin composition such as an epoxy resin or an acrylic resin is arranged on the electrode (6) in a manner such that the anisotropic conductive film (12) is brought into contact with the surface of the electrode (6).

Then, as shown in FIG. 1(d), the electronic component (9) is placed on the anisotropic conductive film (12).

The electronic component (9) includes an element body (14) having a semiconductor chip, and a bump (13) provided on the bottom of the element body (14) and electrically connected with the semiconductor chip. When the bump (13) of the electronic component (9) is arranged on the mounting region (10) in a manner such that the bump (13) faces to the flexible substrate (11) side, the electrode (6) is located between the bump (13) and the disposition surface (7).

The flexible substrate (11) on which the adhesive film (20) is adhered is disposed on a board (30) in a manner such that the substrate film (22) of the adhesive film (20) is in contact with the surface of the board (30). The electronic component (9) is disposed on the anisotropic conductive film (12) in a manner such that the bump (13) is located over the electrode (6). As shown in FIG. 2(a), a pressing member (31) is brought into contact with a surface of the element body (14) of the electronic component (9), while the bump (13) of the electronic component (9) is in contact with the anisotropic conductive film (12). In this state, the electronic component (9) is pressed by the pressing member (31).

A heat-producing apparatus is provided inside the pressing member (31), and the pressing member (31) is heated by the heat-producing apparatus and increased in temperature to a predetermined temperature. The electronic component (9) is brought into contact with the pressing member (31) by pressing, and heated by thermal conduction so as to be increased in temperature.

The anisotropic conductive film (12) is in contact with the bump (13). When the electronic component (9) is pressed, the anisotropic conductive film (12) is pressed by the bump (13). The anisotropic conductive film (12), the electrode (6), the flexible substrate (11) and the adhesive film (20) are arranged consecutively directly opposite each other and in contact with adjacent layers between the board (30) and the portion where the bump (13) and the anisotropic conductive film (12) are in contact with each other. When the electronic component (9) is pressed in a state that the board (30) remains at rest, the bump (13) and the board (30) are pressed toward each other. Accordingly, the electrode (6), the flexible substrate (11), and the adhesive film (20) are also pressed. Furthermore, when the heated electronic component (9) is increased in temperature, the anisotropic conductive film (12), the electrode (6), the flexible substrate (11) and the adhesive film (20) are also heated by heat conduction from the electronic component (9) and increased in temperature.

In the adhesive agent layer (21) of the pressed adhesive film (20), the adhesive agent (26) is also increased in temperature and softened by the pressing force and becomes likely to be deformed.

The material qualities of the resin particles of the conductive particles (19) used in the anisotropic conductive film can be selected from materials such as an epoxy resin, a phenolic resin, an acrylic resin, an acrylonitrile styrene (AS) resin, a benzoguanamine resin, a divinyl benzene-based resin, and a styrene-based resin, for example, to have the desired thermosetting adhesive agent properties.

When the electronic component (9) is pressed toward the board (30), the bump (13) is brought into contact with the conductive particles (19), and presses the conductive particles (19). Accordingly, the conductive particles (19) are pressed against the electrode (6).

At this time, the adhesive agent layer (21) located directly below the portion of the electrode (6) against where the conductive particles (19) are pressed is strongly pressed. Thus, the adhesive agent (26) is deformed to a larger extent than the adhesive agent layer (21) around the pressed adhesive agent (26). As a result, a dent recessed more than the surrounding area is generated in the adhesive agent layer (21) and in the electrode (6) located above the adhesive agent layer (21). When the conductive particles (19) enter the dent of the electrode (6), the conductive particles (19) are no longer strongly pressed.

However, in some embodiments, the adhesive agent layer (21) includes the silica fine particles (25), and has a shear storage modulus at 160° C. of 0.15 MPa or more.

Even when the electronic component (9) is pressed, the pressed adhesive agent (26) is not squeezed out from between the flexible substrate (11) and the substrate film (22), and a dent is not generated in the adhesive agent layer (21) and the electrode (6). Furthermore, the conductive particles (19) are sandwiched between the bump (13) and the electrode (6) to be squashed thereby, and the bump (13) and the electrode (6) are electrically connected.

In brief, when the electronic component (9) is heated and pressed by the pressing member (31) located on the electronic component (9), the pressing force of the pressing member (31) causes the conductive particles (19) located between the bump (13) and the electrode (6) to be squashed. Thus, the flexible mounting module body (15) in which the electrical connection between the bump (13) and the electrode (6) is ensured can be obtained (FIG. 2(b)).

In order to mechanically and electrically connect the electronic component (9) to the electrode (6) through the anisotropic conductive film (12), the electronic component (9) is usually increased in temperature to the range of at least 150° C. and at most 170° C., and the adhesive film (20) is also increased in temperature to a temperature close to this temperature range.

Therefore, in the adhesive agent layer (21) used in the present invention, it is desirable to adjust the content of the silica fine particles (25) such that the shear storage modulus is 0.15 MPa or more when the temperature is increased to a temperature close to the heated temperature of the electronic component (9).

Specifically, in the above-discussed temperature increase range, the silica fine particles (25) are preferably included in an amount of 0.5% by weight or more and 20% by weight or less in the adhesive agent layer.

On the other hand, the adhesive agent (26) desirably has a glass transition temperature in the range of −60° C. or higher to 20° C. or lower in order to obtain strong adhesiveness. In the present invention, even if the adhesive agent

(26) has high fluidity, the shear storage modulus of the adhesive agent layer (21) is set to 0.15 MPa or more by including the silica fine particles (25) having a size of less than 100 nm in the adhesive agent (26).

Furthermore, in embodiments, when a polyimide film is exposed on the back surface of the flexible substrate (11) and the adhesive agent layer (21) is adhered to the polyimide film, the adhesive agent (26) is desirably a nitrile rubber, and the content rate of acrylonitrile in the nitrile rubber is desirably 18% by weight or more and 40.5% by weight or less.

It is noted that the above-discussed content of acrylonitrile is an average value of a bound acrylonitrile content (as measured by JIS K 6384 (2001)).

Figure 3:
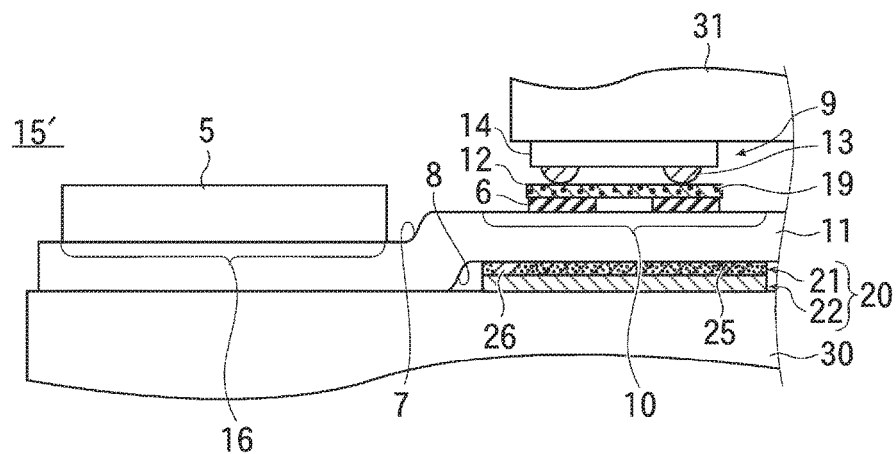
FIGS. 3(a) and 3(b) are each a diagram for explaining a step in a case that an adhesive film is not disposed to a back surface position of an image display region of a support surface.
Figure 3:
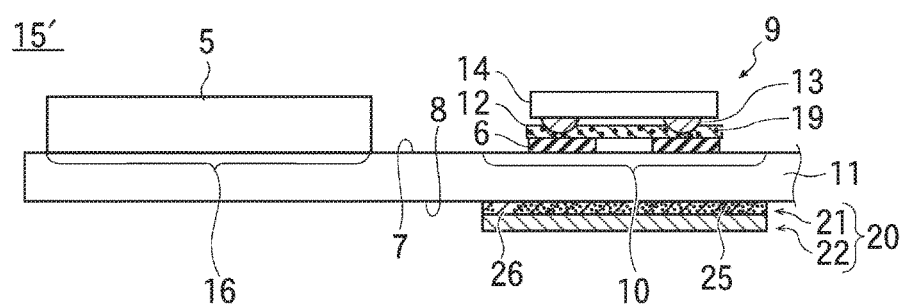

Alternatively, in the support surface (8) as shown in FIG. 3(a), the adhesive film (20) is disposed on the back side of the mounting region (10) of the support surface (8), and the surface on the back surface side of the image display region (16) is exposed. In this state, the surface on the back surface side of the image display region (16) and the substrate film (22) of the adhesive film (20) are brought into contact with the board (30), and the electronic component (9) disposed on the mounting region (10) is pressed by the pressing member (31). Thus, as shown in FIG. 3(b), there can also be obtained a flexible mounting module body 15' in which the back surface side of the image display region (16) of the support surface (8) is exposed, and the adhesive film (20) is located on the back surface side of the mounting region (10) of the support surface (8) and is not located on the back surface side of the image display region (16) of the support surface (8).

In conclusion, in the disclosed embodiments, the adhesive film (20) may be disposed at least in the position directly opposite the mounting region (10).

It is noted that, in some aspects, when the adhesive film (20) is also adhered to the portion located directly opposite the image display region (16) as shown in FIG. 2(b), the adhesive film (20) is located both on the back surface side of the image display region (16) and on the back surface side of the mounting region (10), so that, even when the flexible substrate (11) is placed on a flat surface, deformation such as unevenness is not generated.

EXAMPLES

The disclosed embodiments will be further specifically described with reference to examples below.

First, while a resin solution in which 100 parts by mass of acrylonitrile rubber (NBR-1, center value of bound acrylonitrile content: 18%) is dissolved in MEK (methyl ethyl ketone) as a solvent is stirred, 5 parts by mass of silica fine particles (25) (Nippon Aerosil Co., Ltd., sold under the name "AEROSIL R-974") having a primary particle diameter of 12 nm are added. Then, a dispersion treatment is further performed to obtain a dispersion liquid in which the silica fine particles are dispersed in the acrylonitrile resin solution.

Next, the above-discussed dispersion liquid is poured in a coating applicator and applied onto a substrate film (22) (a polyethylene terephthalate film, 75 μm in thickness). Then the above-discussed MEK is volatilized in a drying oven. Thus, an adhesive film (20) of Example 1 including an adhesive agent layer (21) having a thickness of approximately 17 μm (approximately 92 μm in total thickness when combined with the substrate film) is obtained.

Next, adhesive films (20) of Example 2 and Example 3 are obtained in the same method as in Example 1, except that the added amount of the above-discussed silica fine particles is changed to 10 parts by mass and 15 parts by mass, respectively.

Next, adhesive films (20) of Example 4 and Example 5 are obtained in the same method as in Example 1, except that the acrylic content in the acrylonitrile rubber is changed as shown in Table 2.

Furthermore, an adhesive film as a comparative example is obtained in the same method as in Example 1, except that the silica fine particles are not added.

(Measurement of Peel Strength)

The adhesive films (20) of the respective examples and the adhesive film of the comparative example are each laminated to a flexible substrate (11) (a polyimide film substrate having a thickness of approximately 10 μm) under the conditions of ordinary temperature, a pressure of 0.34 MPa, and 500 mm/min, to thereby prepare a sample piece. The peel strength (peel strength at 180° C.) of the sample piece is measured using a peel strength measuring device (Orientec Corporation, sold under the name "Tensilon"), and the result is evaluated. The evaluation criteria are as follows.

<Evaluation Criteria>

When the peel strength is 12 N/2 cm or more, the adhesive film is evaluated as "double circle," indicating excellent.

When the peel strength is 8 N/2 cm or more and less than 12 N/2 cm, the adhesive film is evaluated as "○ (circle)," indicating good.

When the peel strength is 5 N/2 cm or more and less than 8 N/2 cm, the adhesive film is evaluated as "Δ (triangle)," indicating normal. It is noted that even when the adhesive film is evaluated as "Δ (triangle)," whether the adhesive film is a good product or a defective product can be determined by a known test, and therefore the sample is actually usable.

When the peel strength is less than 5 N/2 cm, the adhesive film is evaluated as "× (cross)," indicating poor.

(Conduction Resistance and Compression Bonding State)

The above-discussed sample piece of the adhesive film according to each of the examples and comparative example is adhered on the back surface side of an electrode (6) of a flexible substrate (11) (here, a sample substrate of which an electrode for connection is provided on a polyimide film having a thickness of approximately 10 μm) under the same conditions as those for preparing the sample piece. Subsequently, an anisotropic conductive film (12) (DP3342MS, Dexerials Corporation) is disposed on the electrode (6), and an electronic component (9) for measuring resistance values is heated and compression-bonded (160° C.-1 MPa-6 sec). The measurement of the conduction resistance value between a bump (13) of the electronic component (9) and the electrode (6), and the confirmation of the compression bonding state by a cross section (the degree of deformation and squashing of conductive particles) are performed using a metal microscope.

It is noted that the conductive particles (19) included in the anisotropic conductive film (12) are resin particles plated with nickel/gold, and have an average particle diameter of 4 μm.

<Evaluation Criteria of Compression State>

When 30% or more of the conductive particles are deformed by pressuring or squashed, the compression state is evaluated as "○ (circle)," indicating good.

When less than 30% of the conductive particles are deformed, the compression state is evaluated as "× (cross)," indicating poor.

(Measurement of Shear Storage Modulus)

The shear storage modulus G' at 160° C. of each of the adhesive films of the examples and comparative example is obtained using a viscoelasticity measuring device (manufactured by HAAKE GmbH, product number: RS-150).

The components of the adhesive agent layer of the adhesive film of each of the examples and comparative example are described in Table 1, and the measurement and observation results obtained by the above-discussed method are also described in Table 1.

TABLE 1

|  | Example 1 | Example 2 | Example 3 | Example 4 | Example 5 | Comparative Example |
|---|---|---|---|---|---|---|
| NBR-1 | 100 | 100 | 100 |  |  | 100 |
| NBR-2 |  |  |  | 100 |  |  |
| NBR-3 |  |  |  |  | 100 |  |
| AEROSIL R974 (silica fine partciles) | 5 | 10 | 15 | 5 | 5 |  |
| G' at 160° C.: shear storage elastic modulus | 0.18 | 0.37 | 0.5 | 0.22 | 0.31 | 0.1 |
| Peel strength at 180° C. | ◎ | ◯ | Δ | ◯ | Δ | ◎ |
| Conduction resistance value between bump and electrode | ◯ | ◯ | ◯ | ◯ | ◯ | X |
| Squashing of conductive particles between bump and electrode (cross section) | ◯ | ◯ | ◯ | ◯ | ◯ | X |

TABLE 2

| Center value of bound acrylonitrile content | |
|---|---|
| NBR-1 | 18 |
| NBR-2 | 29 |
| NBR-3 | 40.5 |

As shown in Table 1, in the comparative example in which the silica fine particles are not included, the peel strength is evaluated as "double circle" and favorable. However, because the silica fine particles are not contained, the shear storage modulus is low. It is understood that as a result, the conductive particles of the anisotropic conductive film are not sufficiently deformed, and the bump and the electrode are not sufficiently electrically connected.

On the other hand, in each example in which the silica fine particles are contained and the adhesive agent layer has a shear storage modulus of more than 0.15 MPa, it is understood that both the electrical connection and the peel strength are improved.

In addition, when the acrylonitrile content is used in the range of 18% by weight or more and 40.5% by weight or less, the peel strength to the flexible substrate (11) can be adjusted. In particular, it is understood that the content that is set to 18% on the lower limit side can obtain high peel strength when an adherend is a polyimide substrate.

REFERENCE NUMERALS

7 . . . disposition surface
8 . . . support surface
9 . . . electronic component
10 . . . mounting region
11 . . . flexible substrate
12 . . . anisotropic conductive film
13 . . . bump
20 . . . adhesive film
21 . . . adhesive agent layer
22 . . . substrate film
25 . . . silica fine particle
26 . . . adhesive agent

What is claimed is:

1. A manufacturing method of a flexible mounting module body, the method comprising:
   disposing a thermosetting anisotropic conductive film including conductive particles in a mounting region provided on a disposition surface that is one surface of a flexible substrate, the flexible substrate further including a second surface that is opposite the one surface;
   disposing an electronic component on the anisotropic conductive film disposed on the mounting region;
   adhering an adhesive film to at least a portion of the second surface that is located directly opposite the mounting region, the adhesive film comprising an adhesive agent layer that (i) contains an adhesive agent and a substrate film that are laminated, (ii) includes silica fine particles having a primary particle diameter of less than 100 nm, and (iii) has a shear storage elastic modulus at 160° C. of 0.15 MPa or more; and
   after the adhesive film adhering, mounting the component on the mounting region of the flexible substrate by electrically connecting a bump of the electronic component and an electrode provided on the mounting region through the conductive particles by heating and compressing the electronic component while the bump is in contact with the anisotropic conductive film.

2. The manufacturing method of a flexible mounting module body according to claim 1, wherein the adhesive agent has a glass transition temperature in a range from −60° C. to 20° C.

3. The manufacturing method of a flexible mounting module body according to claim 1, wherein, in the mounting, the electronic component is heated in a range from 150° C. to 170° C. when the electronic component is heated and pressed.

4. The manufacturing method of a flexible mounting module body according to claim 1,
   wherein an image display region for disposing a display device is provided in the disposition surface, and
   wherein, in the adhesive film adhering, a portion located directly opposite the image display region is included in the portion of the second surface where the adhesive film is adhered.

5. The manufacturing method of a flexible mounting module body according to claim 1, wherein the adhesive agent is a nitrile rubber.

6. The manufacturing method of a flexible mounting module body according to claim 5, wherein the nitrile rubber in the adhesive agent layer includes acrylonitrile in a ratio from 18% by weight to 40.5% by weight.

7. The manufacturing method of a flexible mounting module body according to claim 1, further comprising:
   forming an adhesive agent layer in which the adhesive agent layer is formed by disposing on the substrate film a solution of the adhesive agent containing at least 5 parts by weight of the silica fine particles with respect to 100 parts by weight of the adhesive agent in a powder state.

\* \* \* \* \*